United States Patent
Engelen

(10) Patent No.: US 11,231,159 B2
(45) Date of Patent: Jan. 25, 2022

(54) LIGHTING DEVICE INCLUDING A TRANSPARENT STRUCTURE

(71) Applicant: Lumileds LLC, San Jose, CA (US)

(72) Inventor: Rob Jacques Paul Engelen, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/074,693

(22) Filed: Oct. 20, 2020

(65) Prior Publication Data

US 2021/0033259 A1 Feb. 4, 2021

Related U.S. Application Data

(63) Continuation of application No. 16/474,911, filed as application No. PCT/EP2017/083758 on Dec. 20, 2017, now Pat. No. 10,845,026.
(Continued)

(30) Foreign Application Priority Data

Feb. 7, 2017 (EP) .................................... 17154972

(51) Int. Cl.
*F21V 5/00* (2018.01)
*F21V 7/28* (2018.01)
(Continued)

(52) U.S. Cl.
CPC ................ *F21V 5/007* (2013.01); *F21V 7/28* (2018.02); *G02B 3/0056* (2013.01);
(Continued)

(58) Field of Classification Search
CPC ........ F21Y 2115/10; F21V 5/007; F21V 5/04; G02B 3/006; G02B 3/0056; G02B 3/0043
See application file for complete search history.

(56) References Cited

U.S. PATENT DOCUMENTS 7,766,530 B2 * 8/2010 Hwang .............. G02B 19/0061
362/613
8,704,256 B2 4/2014 Sekii
(Continued)

FOREIGN PATENT DOCUMENTS

DE 202014003075 U1 4/2014
EP 2025995 A2 2/2009
(Continued)

OTHER PUBLICATIONS

"U.S. Appl. No. 16/474,911, Final Office Action dated Apr. 29, 20", 7 pgs.
(Continued)

*Primary Examiner* — Robert J May
(74) *Attorney, Agent, or Firm* — Schwegman Lundberg & Woessner, P.A.

(57) ABSTRACT

A system can include a light emitting diode (LED) and a transparent structure disposed over the LED. The transparent structure includes a first surface that reflects light extracted from the LED and incident on the first surface. The transparent structure also includes an exit surface opposite the first surface. The exit surface includes a first area that is textured to diffuse light over a first angular range and a second area that is textured to diffuse light over a second angular range. The second angular range is wider than the first angular range.

17 Claims, 3 Drawing Sheets

Related U.S. Application Data

(60) Provisional application No. 62/440,317, filed on Dec. 29, 2016.

(51) Int. Cl.
*G02B 3/00* (2006.01)
*G02B 19/00* (2006.01)
*G02B 27/30* (2006.01)
*F21Y 115/10* (2016.01)
*F21V 7/06* (2006.01)

(52) U.S. Cl.
CPC ......... *G02B 19/0066* (2013.01); *G02B 27/30* (2013.01); *F21V 7/06* (2013.01); *F21Y 2115/10* (2016.08)

(56) References Cited

U.S. PATENT DOCUMENTS

| | | | |
|---|---|---|---|
| 10,718,492 B2 * | 7/2020 | Harrold | G02F 1/133603 |
| 2008/0100773 A1 | 5/2008 | Hwang et al. | |
| 2016/0327712 A1 | 11/2016 | Shin | |
| 2019/0331314 A1 | 10/2019 | Engelen | |

FOREIGN PATENT DOCUMENTS

| | | |
|---|---|---|
| EP | 2276076 A1 | 1/2011 |
| JP | 2009-266523 A | 11/2009 |
| JP | 2010-032781 A | 2/2010 |
| JP | 2013-137890 A | 7/2013 |
| WO | WO-2007049176 A1 | 5/2007 |
| WO | WO-2012144325 A1 | 10/2012 |
| WO | WO-2015185519 A1 | 12/2015 |
| WO | WO-2018122059 A1 | 7/2018 |

OTHER PUBLICATIONS

"U.S. Appl. No. 16/474,911, Non Final Office Action dated Jan. 9, 2020", 11 pgs.

"U.S. Appl. No. 16/474,911, Notice of Allowance dated Jul. 17, 2020", 6 pgs.

"U.S. Appl. No. 16/474,911, Response filed Apr. 9, 2020 to Non Final Office Action dated Jan. 9, 2020", 16 pgs.

"U.S. Appl. No. 16/474,911, Response filed Jun. 29, 20 to Final Office Action dated Apr. 29, 2020", 7 pgs.

"International Application Serial No. PCT/EP2017/083758, International Search Report dated Feb. 28, 2018", 4 pgs.

"International Application Serial No. PCT/EP2017/083758, Written Opinion dated Feb. 28, 2018", 7 pgs.

"European Application No. 17154972.8, extended Search Report dated Jul. 17, 2019", 10 pgs.

"Japanese Application Serial No. 2019-534978, Request for Examination and Written Amendment filed Dec. 21, 20", (w/ English Translation), 10 pgs.

"Korean Application Serial No. 10-2019-7022286, Request for Examination and Amendment filed Dec. 21, 2020", (w/ English Translation), 24 pgs.

"Japanese Application Serial No. 2019-534978, Notification of Reasons for Refusal dated Nov. 2, 21", (w/ English Translation), 9 pgs.

* cited by examiner

LIGHTING DEVICE INCLUDING A TRANSPARENT STRUCTURE

PRIORITY APPLICATIONS

This application is a continuation of and claims the benefit of priority of U.S. patent application Ser. No. 16/474,911, filed on Jun. 28, 2019, which is a U.S. National Stage Filing under 35 U.S.C. 371 from International Application No. PCT/EP2017/083758, filed on Dec. 20, 2017, and published as WO/2018/122059, which claims priority to European Patent application No. 17154972.8, filed on Feb. 7, 2017, and U.S. Provisional Patent Application No. 62/440,317, filed on Dec. 29, 2016, all of which are incorporated herein by reference in their entireties.

BACKGROUND

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, tor example. Mg, formed over the active region. Electrical contacts are formed on the n- and p-type regions.

An LED emits light with a very wide angular range. For use in spot lamps, such as an MR16-compatible bulb or a GU10-compatible bulb, a beam with a narrow angular spread is desired. A total internal reflection (TIR) collimator positioned over the LED is a common solution to redirect the light from an LED into a tight beam.

FIGS. 1 and 2 illustrate a prior art luminaire 15 having a TIR collimation optic 16 and an LED light emission device 18. The structure of FIGS. 1 and 2 is described in more detail in U.S. Pat. No. 8,038,319. The LED light emission device 18 includes an LED emitter array 20 mounted on printed wiring board (PWB) 22. The LED emitter array 20 and PWB 22 cooperate to produce emitted light. A phosphor conversion cavity 24 converts the emitted light to a phosphor-emitted light having a more desirable color rendering index (CRI), for instance by changing the wavelength of the emitted light from blue to yellow to form mixed light with a white color.

The phosphor-emitted light next passes through a light extraction lens 26, which is typically made from cyclic olefin copolymer (COC) or glass. The light extraction lens 26 increases the usable proportion of the phosphor-emitted light. The light extracted by light extraction lens 26 passes through the interior polynomial surface 28 of the light collimation device 30. Light passing through the interior polynomial surface 28 with a low elevation angle will reflect from the inner surface of outer TIR mirror 32. The space 36 between the interior polynomial surface 28 and the outer TIR mirror 32 is filled with the solid optical polymer. The outer TIR mirror 32 functions to produce collimated light. A void 34 is provided in the tight collimation device 30 to reduce the sink (i.e., undesirable depressions often experienced when violating uniform thickness rules for optical molding.

The collimated light passes through a lens 38 with wisp lenslet array 40 on the exit face of the TIR collimation optic 16, A top view of an exemplary exit face of the TIR collimation optic 16 is illustrated in FIG. 3, The wisp lenslet array 40 includes a plurality of wisp lenslets 42 forming an array of wisp lenslets formed on the surface 44. The quantity, placement and orientation of individual wisp lenslets might vary.

DETAILED DESCRIPTION

Figure 1:
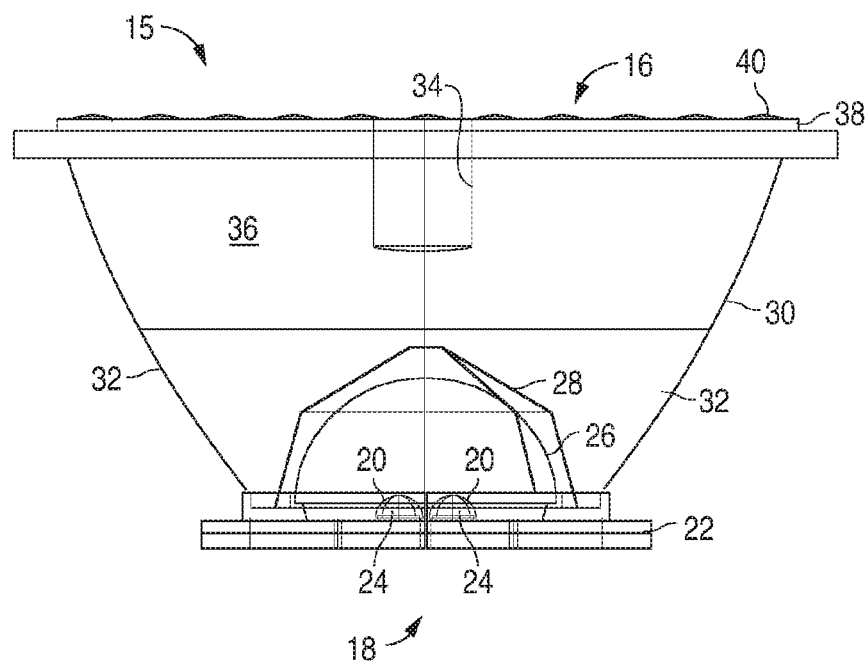
FIG. 1 is a side plan view illustration of a prior art luminaire.
Figure 2:
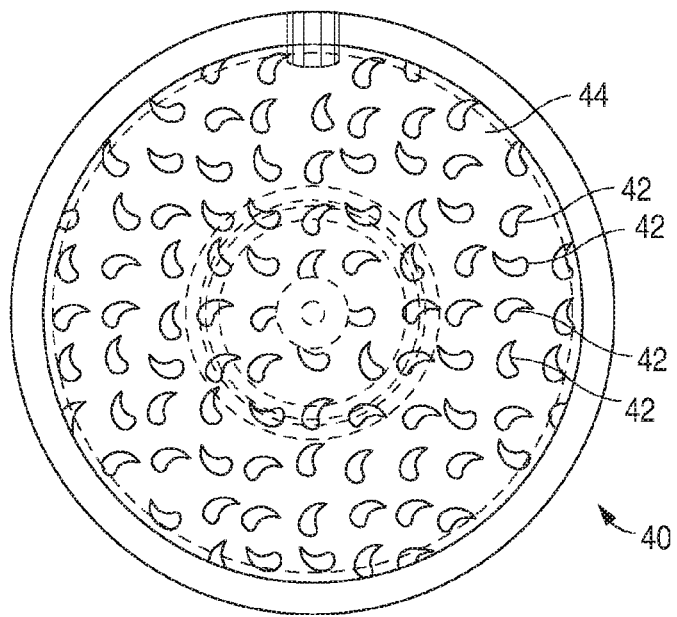
FIG. 2 is a top plan view illustration of the luminaire of FIG. 1.

In a device including a TIR collimator such as the device of FIGS. 1 and 2, often the light is collimated too much, meaning that the beam from the TIR collimator is too narrow. The too-narrow beam may be modified by adding texture to the top surface of the collimator lens, such as for example as illustrated in FIG. 2.

As illustrated in FIG. 2, the lenslets are formed in a uniform array. However, the light extraction lens 26 of FIG. 1 may produce a poorly collimated beam, while the TIR surface 32 may produce a well collimated beam. Accordingly, the uniform array of lenslets illustrated in FIG. 2, when applied to each of these collimated beams, may create too much diffusion for the poorly collimated beam, and too little diffusion for the well collimated beam. As a result, the optical performance of such a lens may be limited.

In embodiments of the invention, the top, exit surface of a transparent structure such as a collimating optic includes a structure that causes diffusion or scattering of the light exiting the collimating structure. Different areas of the exit surface may be textured or patterned to cause different amounts of diffusion or scattering. For example, an area above a refracting lens may cause less scattering than an area above a TIR surface. In some embodiments, the exit surface is patterned with lenslets. The optical power of the lenslets may vary as a function of position on the exit surface. For a spherical lenslet, the optical power may be estimated by the radius of curvature of the lenslet. For example, the optical power is determined by the "steepness" of the features. Lenslets with moderate gradients (near flat, larger radius of curvature) will have low optical power. Lenslets with steep gradients (taller, smaller radius of curvature) cause the light to bend mote and such lenslets accordingly have stronger optical power.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used. Blue or UV emitting light emitting devices are often combined with one or more wavelength converting materials to add different colors of light, such that combined light from the light emitting device and the wavelength converting materials appears white.

Figure 3:
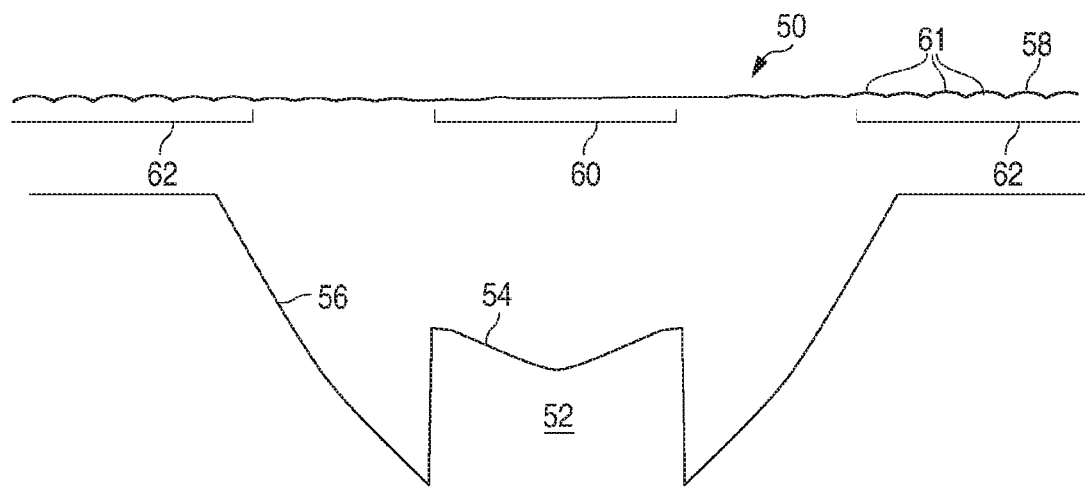
FIG. 3 is a cross sectional view of a transparent structure including a solid optic disposed over an LED.

FIG. 3 illustrates a transparent structure according to some embodiments. The transparent structure 50 may be, for example, a collimating optic formed from a solid, transparent material such as PMMA, polycarbonate, silicone, glass, or any other suitable material. A surface that forms convex, refractive lens 54 is located near the center of the structure 50. One or more LCDs or other suitable light sources are disposed outside the structure 50 in a region 52 below the refractive lens 54. Extending upward from the bottom of region 52 are one or more curved, flat, or other surfaces 56 that cause total internal reflection. The structure 50 illustrated in FIG. 3 may be rotationally symmetric, though this is not required.

A majority of light exits the structure 50 through the top surface 58. The top surface 58 is textured to cause diffusion or scattering of the light exiting through the top surface. Different areas of the top surface are patterned or textured to cause different levels of diffusion or scattering. In some embodiments, the top surface 58 is patterned with lenslets 61.

Light from the central refractive lens 54 is usually not strongly collimated; therefore in some embodiments, the optical power of the lenslets 61 in area 60, above the refractive lens 54, may be small. At the rim of the TIR surface 56, the light is usually well collimated; therefore in some embodiments, the optical power of the lenslets 61 in area 62, above the outer edge of the TIR surface far from the center of the lens, may be large. In some embodiments, in area 62, the top surface is textured (for example, with lenslets or any other suitable structure) to diffuse light over a first angular range, and in area 60, the top surface is textured to diffuse light over a second angular range that is broader/wider than the first angular range.

In some embodiments, the shape of lenslets 61 may be considered hills separated by valleys, or hills separated by or surrounded by a flat region of the top surface. In some embodiments, in areas 62 of the top surface 58 requiring more optical power, the height of the lenslets 61 (i.e. the height of the hills) may be larger, and/or the distance between neighboring lenslets 61 (i.e. between neighboring hills) may be smaller, as compared to the lenslets in areas 60 requiring less optical power. In some embodiments, in areas 62 of the top surface 58 requiring more optical power, the radius of curvature of lenslets 61 may be less than the radius of curvature of the lenslets in areas 60 requiring less optical power.

In some embodiments, the entire surface 58 is covered by lenslets disposed in a hexagonal or near hexagonal array, or dimples disposed in a similar arrangement. In some embodiments, the spacing and arrangement of the lenslets on the surface 58 is consistent across the entire top surface 58, while the height of lenslets 61 differs in areas 62 and 60. In some embodiments, the spacing and arrangement of the lenslets varies across the top surface, for example between areas 62 and 60. The coverage of the lenslets on the top surface 58 is often 100%, for optical reasons. In some embodiments, the lenslets occupy less than 100% of the top surface 58.

For example, the height of lenslets 61 (i.e. the height of the hills or the height from hilltop to valley) in area 62 may be at least 20 µm in some embodiments and no more than 1 mm in some embodiments, while the height of lenslets 61 in area 60 may be at least 0 µm in some embodiments and no more than 0.8 µm in some embodiments. The height of the lenslets 61 in area 60 may be at least 0% in some embodiments and no more than 80% in some embodiments of the height of the lenslets 61 in area 62.

For example, the pitch between adjacent lenslets is at least 50 µm in some embodiments and no more than 2 mm in some embodiments. The aspect ratio (AR) is defined as height difference between peak and valley of a lenslet divided by the distance between neighboring lenslets. The AR in area 62 may be larger than the AR in area 60, in some embodiments. The AR in area 62 may be at least 20% in some embodiments and no more than 100% in some embodiments. The AR in area 60 may be at least 0% in some embodiments and no more than 50% in some embodiments. The AR in area 60 may be at least 80% or less than the AR in area 62 in some embodiments. The coverage of the surface 58 by lenslets 61 may be at least 50% in area 62 in some embodiments and at least 0% in area 60 in some embodiments.

The lenslets may be rotationally symmetric or non-rotationally symmetric, such as elliptical or any other shape.

In some embodiments, within a given area of the exit surface 58, the lenslets are arranged in a regular array and are substantially the same size and shape. However, between different areas of the exit surface, the arrangement and/or the size and shape of the lenslets varies. For example, within each of areas 60 and 62, the lenslets may be arranged in a regular array and may be substantially the same size and shape. However, the array, size, and/or shape of the lenslets in area 60 may differ from area 62.

In some embodiments, over alt or a portion of the exit surface 58, the spacing, size, and/or shape may vary continuously. For example, in some embodiments, a feature of the lenslets 61, such as the radius of curvature, the height, or any other feature, varies continuously over a portion of the top surface 58, including area 60, area 62, and a region between areas 60 and 62.

In some embodiments, the different areas 60 and 62 of lenslets may be implemented on an exit surface that also includes areas that are smooth, substantially flat, and/or roughened (i.e., randomly textured).

Figure 4:
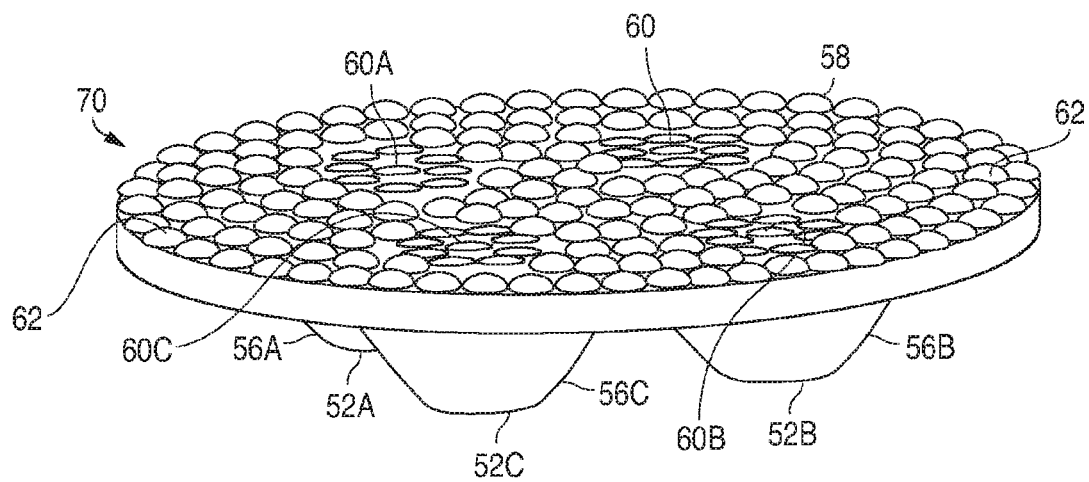
FIG. 4 illustrates a collimating optic including multiple refractive lenses, TIR surfaces, and an exit surface having areas with different texturing.

FIG. 4 illustrates an optic 70 including four refractive lenses, arranged in a 2×2 array. One LED or a group of LEDs may be disposed under each refractive lens. Three regions 52A, 52B, and 52C, and three TIR surfaces 56A, 56B, and 56C are visible in the view of FIG. 4. On the top surface 58 of the optic 70, four regions 60, 60A, 60B, and 60C which include texturing that produces less optical power, are surrounded by a region 62, which includes texturing that produces more optical power. The top surface of the optic is textured, for example according to any of the examples or embodiments described above. For example, lenslets may be formed over the entire top surface of optic 70. In region 62, the lenslets are taller, have a smaller radius of curvature, and/or have greater optical power than the lenslets in regions 60, 60A, 60B, and 60C.

Figure 5:
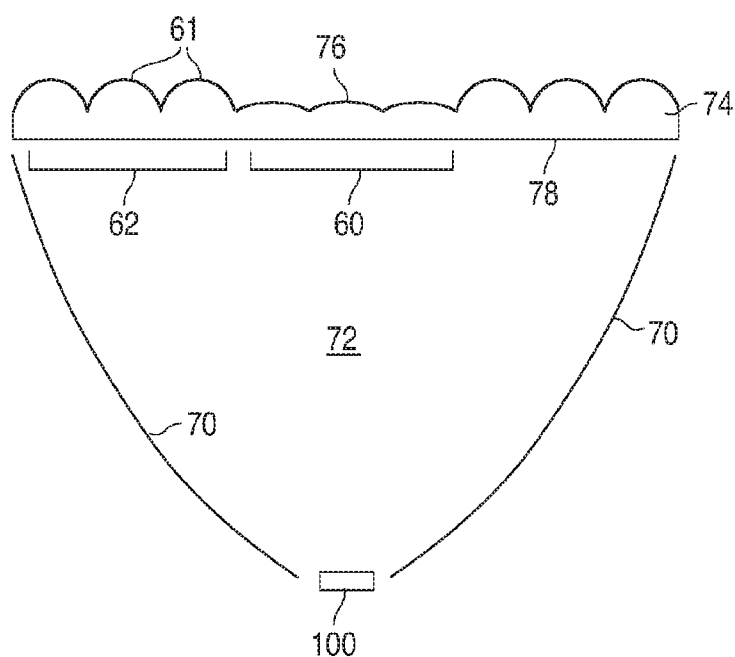
FIG. 5 is a cross sectional view of a transparent structure including side Reflectors and a transparent cover disposed over an LED.

In the devices illustrated in FIGS. 3 and 4, a solid, transparent optic is disposed over the light source(s). In the device illustrated in FIG. 5, a hollow, reflective optic is used. In FIG. 5, the transparent structure includes reflective sidewalls 70 disposed over a light source such as an LED 100. Unlike the TIR surfaces illustrated in FIGS. 3 and 4, the reflective sidewalls 70 may be, for example, formed from a reflective material such as a reflective metal, reflective plastic or resin, or any other suitable reflective material, or a reflective material such as reflective metal, reflective plastic, or reflective paint may be formed on a surface of, for example, a non-reflective structure such as plastic, metal, or any other suitable material. The area 72 between the reflective sidewalls 70 may be filled with air, ambient gas, vacuum, a liquid material, a gel material, a solid material, or any other suitable material.

A transparent plate or other structure 74 is disposed over the reflective sidewalls 70 and area 72. Transparent plate 74 may act as a cover and may be formed from any suitable material, including the materials for solid optics described in the above examples and embodiments. Light enters the transparent structure 74 through bottom surface 78 and exits through top surface 76. The top surface 76 is textured, for example according to any of the examples or embodiments described above. A plurality of lenslets 61 are formed on the top surface 76 in the example illustrated in FIG. 5. As described above, the optical power of the lenslets may differ in different areas of the top surface. In area 60 above LED 100, the lenslets may be smaller in height, may have less optical power, and may have a greater radius of curvature than the lenslets in area 62 above the reflective sidewalls 70. In some embodiments, the bottom surface 78 may be textured, for example as described above, instead of or in addition to the top surface 76.

The examples described above may be suitable for applications such as general illumination, backlighting, or any other suitable lighting application. In some embodiments, the examples described above may be integrated into any suitable light bulb, such as, for example, an Edison bulb, a multifaceted reflector (MR) bulb, a parabolic aluminized reflector (PAR) bulb, a bulged reflector (BR) bulb, a dimmable bulb, or any other suitable package.

Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. A characteristic of a structure described in the context of one embodiment, may be applicable to any embodiment. Therefore, it is not intended that the scope of the invention be limited to the specific embodiments illustrated and described.

What is being claimed is:

1. A lighting system, comprising:
    a plurality of light sources that are disposed on respective separate substrates and are configured to generate light; and
    a transparent structure configured to collect and diffuse the light from the plurality of light sources,
        the transparent structure including a lower surface that faces the plurality of light sources and an upper surface opposite the lower surface,
        the lower surface shaped to include a plurality of lower surface protrusions that are spaced apart from one another,
        each lower surface protrusion being shaped to direct the light from a corresponding light source into the transparent structure and toward the upper surface,
        the upper surface being textured to diffuse the light from the plurality of light sources and direct the light from the plurality of light sources out of the transparent structure,
        the upper surface including a plurality of first diffusing regions that are located opposite the corresponding lower surface protrusions,
        the first diffusing regions being textured to diffuse light into a first angular range,
        the upper surface including a second diffusing region located between first diffusing regions of the plurality of first diffusing regions,
        the second diffusing region being textured to diffuse light into a second angular range that is wider than the first angular range.

2. The lighting system of claim 1, wherein the second diffusing region surrounds the first diffusing regions.

3. The lighting system of claim 1, wherein the second diffusing region extends to a periphery of the upper surface.

4. The lighting system of claim 1, wherein:
    the first diffusing regions are textured with a plurality of first lenslets disposed in a first array;
    the second diffusing region is textured with a plurality of second lenslets disposed in a second array;
    an aspect ratio of the array of lenslets is defined by a height of a lenslet divided by a distance between neighboring lenslets;
    the first lenslets have a first aspect ratio; and
    the second lenslets have a second aspect ratio that is greater than the first aspect ratio.

5. The lighting system of claim 4, wherein the second lenslets are taller than the first lenslets.

6. The lighting system of claim 4, wherein the second lenslets have a smaller radius of curvature than the first lenslets.

7. The lighting system of claim 1, wherein a lower surface protrusion of the plurality of lower surface protrusions includes:
    a central portion configured to direct light from a corresponding light source into the transparent structure as internal light; and
    a peripheral portion configured to reflect the internal light toward the upper surface.

8. The lighting system of claim 1, wherein each light source of the plurality of light sources includes at least one light-emitting diode.

9. The lighting system of claim 1, wherein each light source of the plurality of light sources includes a single light-emitting diode.

10. A method, comprising:
    generating light with a plurality of light sources that are disposed on respective separate substrates;
    directing the generated light from the plurality of light sources into a transparent structure via a corresponding plurality of protrusions in a lower surface of the transparent structure to form internal light inside the transparent structure;
    propagating the internal light from the lower surface to an upper surface opposite the lower surface, the upper surface including a plurality of first diffusing regions that are located opposite the corresponding lower surface protrusions, the upper surface including a second diffusing region located between first diffusing regions of the plurality of first diffusing regions;

diffusing the internal light with the upper surface to form diffused light that the exits the transparent structure;

directing a first portion of the internal light onto the plurality of first diffusing regions to diffuse the first portion of the internal light into a first angular range; and directing a second portion of the internal light onto the second diffusing region to diffuse the second portion of the internal light into a second angular range that is wider than the first angular range.

11. The method of claim 10, wherein:

the first diffusing regions are textured with a plurality of first lenslets disposed in a first array;

the second diffusing region is textured with a plurality of second lenslets disposed in a second array;

an aspect ratio of the array of lenslets is defined by a height of a lenslet divided by a distance between neighboring lenslets;

the first lenslets have a first aspect ratio; and the second lenslets have a second aspect ratio that is greater than the first aspect ratio.

12. The method of claim 11, wherein the second lenslets are taller than the first lenslets.

13. The method of claim 11, wherein the second lenslets have a smaller radius of curvature than the first lenslets.

14. The method of claim 10, further comprising:

directing at least some of the generated light from a light source of the plurality of light sources onto a central portion of the corresponding protrusion to enter the transparent structure as internal light;

directing at least some of the internal light onto a peripheral portion of the corresponding protrusion; and reflecting at least some of the internal light from the peripheral portion to form reflected light; and directing the reflected light toward the upper surface.

15. A lighting system, comprising:

a plurality of light-emitting diodes (LEDs) that are disposed on respective separate substrates and are configured to generate light; and a transparent structure configured to collect and diffuse the light from the plurality of LEDs, the transparent structure including a lower surface that faces the plurality of light sources and an upper surface opposite the lower surface, the lower surface shaped to include a plurality of lower surface protrusions that correspond to the plurality of light sources and are spaced apart from one another, each lower surface protrusion being shaped to direct the light from a corresponding light source into the transparent structure and toward the upper surface as internal light, the upper surface being textured to diffuse the internal light and direct the internal light out of the transparent structure, the upper surface including a plurality of first diffusing regions that correspond to the plurality of lower surface protrusions, the first diffusing regions being located opposite the corresponding lower surface protrusions, the first diffusing regions being textured to diffuse light into a first angular range, the upper surface including a second diffusing region that surrounds the first diffusing regions and is textured to diffuse light into a second angular range that is wider than the first angular range.

16. The lighting system of claim 15, wherein the second diffusing region extends to a periphery of the upper surface.

17. The lighting system of claim 15, wherein:

the first diffusing regions are textured with a plurality of first lenslets disposed in a first array;

the second diffusing region is textured with a plurality of second lenslets disposed in a second array;

an aspect ratio of the array of lenslets is defined by a height of a lenslet divided by a distance between neighboring lenslets;

the first lenslets have a first aspect ratio; and the second lenslets have a second aspect ratio that is greater than the first aspect ratio.

* * * * *